US011428758B2

United States Patent
Hu et al.

(10) Patent No.: US 11,428,758 B2
(45) Date of Patent: *Aug. 30, 2022

(54) HIGH SENSITIVITY TMR MAGNETIC SENSOR

(71) Applicant: Western Digital Technologies, Inc., San Jose, CA (US)

(72) Inventors: Chih-Ching Hu, Pleasanton, CA (US); Yung-Hung Wang, San Jose, CA (US); Ming Mao, Dublin, CA (US); Daniele Mauri, San Jose, CA (US); Ming Jiang, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 389 days.

This patent is subject to a terminal disclaimer.

(21) Appl. No.: 16/718,351

(22) Filed: Dec. 18, 2019

(65) Prior Publication Data
US 2021/0063503 A1  Mar. 4, 2021

Related U.S. Application Data

(60) Provisional application No. 62/892,405, filed on Aug. 27, 2019.

(51) Int. Cl.
*G01R 33/09* (2006.01)
*H01L 43/08* (2006.01)
(Continued)

(52) U.S. Cl.
CPC ....... *G01R 33/098* (2013.01); *H01F 10/3254* (2013.01); *H01F 10/3272* (2013.01);
(Continued)

(58) Field of Classification Search
CPC .............. G01R 33/098; G01R 33/0052; G01R 33/0005; G01R 33/093; H01F 10/3254;
(Continued)

(56) References Cited

U.S. PATENT DOCUMENTS 7,286,329 B1 * 10/2007 Chen .............. G01R 31/318357
360/324.12
9,591,221 B2   3/2017 Miller et al.
(Continued)

FOREIGN PATENT DOCUMENTS

| CN | 202939205 U | 5/2013 |
|----|-------------|--------|
| EP | 2696210 A2 | 2/2014 |
| JP | 2018073913 A | 5/2018 |

OTHER PUBLICATIONS

Ferreira et al. "2-Axis Magnetometers Based on Full Wheatstone Bridges Incorporating Magnetic Tunnel Junctions Connected in Series," IEEE Transactions On Magnetics, vol. 48, No. 11, Nov. 2012, pp. 4107-4110.

(Continued)

*Primary Examiner* — Alvaro E Fortich
*Assistant Examiner* — Zannatul Ferdous
(74) *Attorney, Agent, or Firm* — Patterson + Sheridan, LLP; Steven H. VerSteeg

(57) ABSTRACT

A tunneling magnetoresistance (TMR) sensor device is disclosed that includes one or more TMR resistors. The TMR sensor device comprises a first TMR resistor comprising a first TMR film, a second TMR resistor comprising a second TMR film different than the first TMR film, a third TMR resistor comprising the second TMR film, and a fourth TMR resistor comprising the first TMR film. The first and fourth TMR resistors are disposed in a first plane while the second and third TMR resistors are disposed in a second plane different than the first plane. The first TMR film comprises a synthetic anti-ferromagnetic pinned layer having a magnetization direction of a reference layer orthogonal to a magnetization direction a free layer. The second TMR film comprises a double synthetic anti-ferromagnetic pinned (Continued)

layer having a magnetization direction of a reference layer orthogonal to a magnetization direction of a free layer.

20 Claims, 13 Drawing Sheets

(51) Int. Cl.
*H01L 27/22* (2006.01)
*H01L 43/10* (2006.01)
*H01L 43/12* (2006.01)
*H01F 10/32* (2006.01)
*H01F 41/30* (2006.01)

(52) U.S. Cl.
CPC .......... *H01F 41/302* (2013.01); *H01L 27/22* (2013.01); *H01L 43/08* (2013.01); *H01L 43/10* (2013.01); *H01L 43/12* (2013.01)

(58) Field of Classification Search
CPC ... H01F 10/3272; H01F 41/302; H01L 27/22; H01L 43/08; H01L 43/10; H01L 43/12
See application file for complete search history.

(56) References Cited

U.S. PATENT DOCUMENTS

| | | | |
|---|---|---|---|
| RE46,428 E | | 6/2017 | Mather et al. |
| 9,684,184 B2 | | 6/2017 | Miller et al. |
| 10,868,235 B2* | 12/2020 | Beach ................. H01L 27/224 |
| 10,916,696 B2* | 2/2021 | Pinarbasi ............. H01L 43/12 |
| 2004/0196693 A1* | 10/2004 | Iwata ..................... G11C 29/08 365/158 |
| 2011/0025318 A1 | 2/2011 | Saruki et al. |
| 2011/0025320 A1* | 2/2011 | Ohta ...................... H01L 27/22 324/252 |
| 2011/0169112 A1* | 7/2011 | Chen ..................... H01L 43/08 257/E29.323 |
| 2011/0233700 A1 | 9/2011 | Hayakawa et al. |
| 2012/0049843 A1* | 3/2012 | Sun ........................ H01L 43/12 324/252 |
| 2013/0229175 A1 | 9/2013 | Wang et al. |
| 2015/0331071 A1 | 11/2015 | Davies |
| 2017/0322052 A1 | 11/2017 | Paul et al. |
| 2018/0335484 A1 | 11/2018 | Campiglio et al. |
| 2019/0020822 A1 | 1/2019 | Sharma et al. |
| 2021/0063502 A1* | 3/2021 | Hu ....................... G01R 33/093 |

OTHER PUBLICATIONS

Freitas et al. "Spintronic Sensors," Proceedings of the IEEE, Oct. 2016, vol. 104, No. 10, pp. 1894-1918.

Lopes "MgO Magnetic Tunnel Junction sensors in Full Wheatstone bridge configuration for Electrical current detection," Oct. 15, 2012, 8 pages, <https://fenix.tecnico.ulisboa.pt/downloadFile/395144787699/resumo.pdf>.

International Search Report and the Written Opinion for International Application No. PCT/US2020/024076 dated Jul. 17, 2020, 9 pages.

International Preliminary Report on Patentability for International Application No. PCT/US2020/024076 dated Mar. 10, 2022, 6 pages.

* cited by examiner

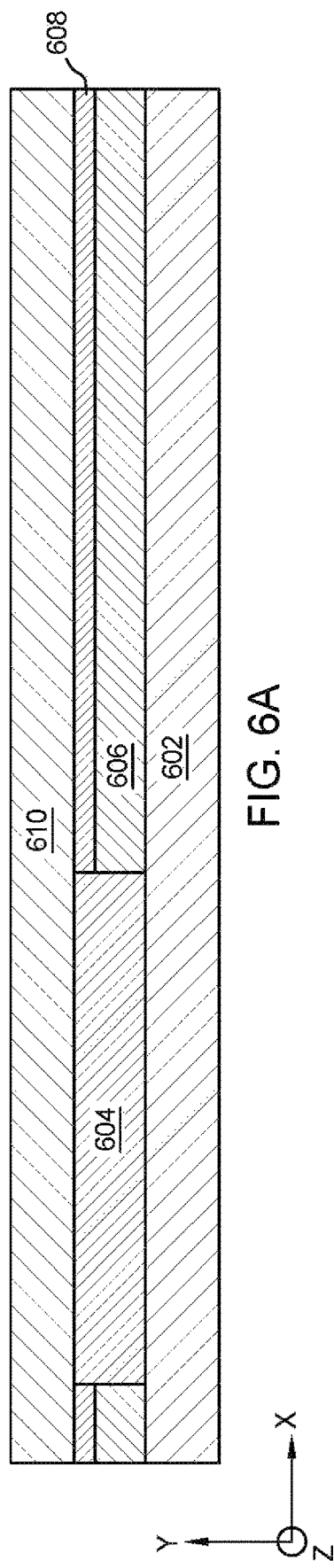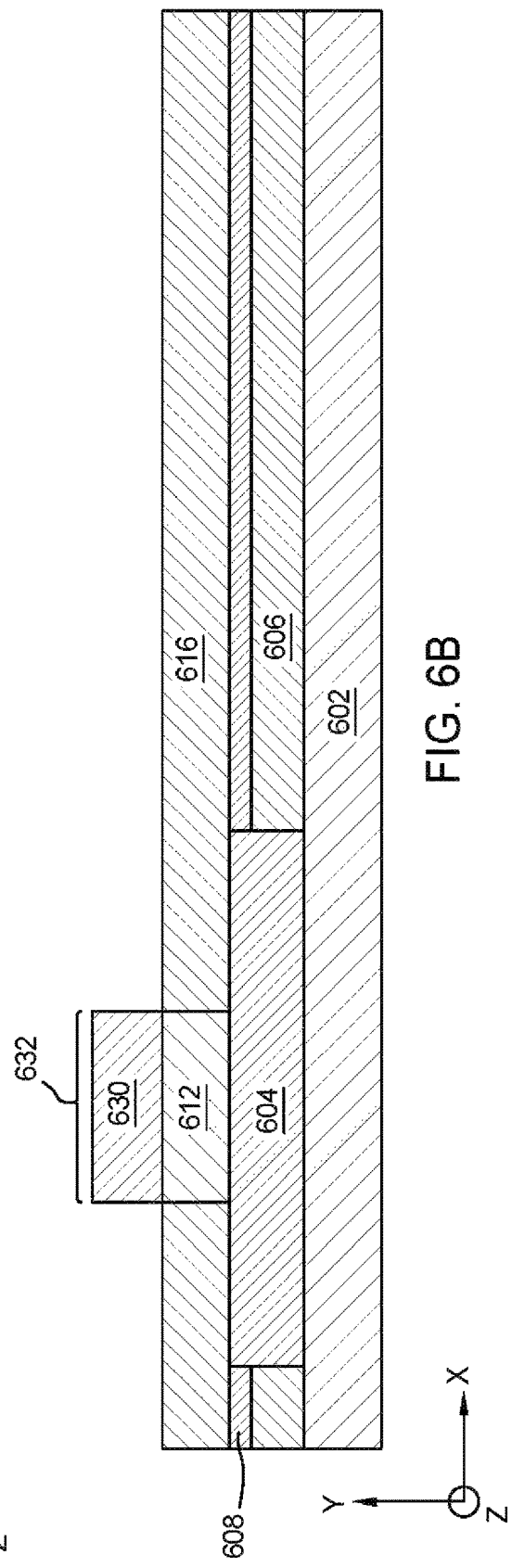

HIGH SENSITIVITY TMR MAGNETIC SENSOR

CROSS-REFERENCE TO RELATED APPLICATIONS

This application claims benefit of U.S. provisional patent application Ser. No. 62/892,405, filed Aug. 27, 2019, which is herein incorporated by reference.

BACKGROUND OF THE DISCLOSURE

Field of the Disclosure

Embodiments of the present disclosure generally relate to a tunneling magnetoresistance sensor device, such as a Wheatstone bridge, and a method of fabrication thereof.

Description of the Related Art

A Wheatstone bridge is an electrical circuit used to measure the electrical resistance of an unknown component by balancing two legs of a bridge circuit, one leg of which includes the unknown component. The Wheatstone circuit provides extremely accurate measurements in comparison to a simple voltage divider.

The Wheatstone bridge has recently been employed in magnetic sensor applications. The Wheatstone bridge includes multiple resistors based on magnetic Hall effect, anisotropy magnetoresistive (AMR) effect, giant magnetoresistive (GMR) effect, and tunneling magnetoresistive (TMR) effect. The TMR based magnetic sensor has a very high sensitivity compared to other magnetic sensors.

Typical TMR based Wheatstone bridges comprise four resistors, which are made of TMR films. To enable the Wheatstone bridge characteristics for magnetic field sensing, opposite signs of resistance-field dependence are required for the first and the fourth resistors against the second and the third resistors. One way to realize this has been the fabrication of the first and the fourth resistors with stripe orientation at +45° to a designed field sensing direction and the second and the third resistors with stripe orientation at −45° to the designed field sensing direction. All four of the resistors are comprised of the same TMR material or film, and as such, the pinned layer of each of the four resistors have similar the same magnetization directions, designated perpendicular to the field sensing direction.

When applying a magnetic field to the Wheatstone bridge, the resistance of the first and fourth resistors increases or decreases with the applied magnetic field while the resistance of the second and third resistors decreases or increases with the applied magnetic field, realizing bridge characteristic differential output. The efficiency of a Wheatstone bridge formed as such is, however, not optimal since the full range of the magnetoresistance change is unable to be utilized in such a design due to the ±45° sensor stripe orientations, resulting in reduced output voltage or limited sensitivity.

Therefore, there is a need in the art for a magnetic sensor, and method of fabricating thereof, that operates in the full magnetoresistance range while achieving the maximum output voltage or sensitivity.

SUMMARY OF THE DISCLOSURE

A TMR sensor device is disclosed that includes one or more TMR resistors. The TMR sensor device comprises a first TMR resistor comprising a first TMR film, a second TMR resistor comprising a second TMR film different than the first TMR film, a third TMR resistor comprising the second TMR film, and a fourth TMR resistor comprising the first TMR film. The first and fourth TMR resistors are disposed in a first plane while the second and third TMR resistors are disposed in a second plane different than the first plane. The first TMR film comprises a synthetic anti-ferromagnetic pinned layer having a magnetization direction of a reference layer orthogonal to a magnetization direction a free layer. The second TMR film comprises a double synthetic anti-ferromagnetic pinned layer having a magnetization direction of a reference layer orthogonal to a magnetization direction of a free layer.

In one embodiment, a TMR sensor device comprises a first TMR resistor comprising a first TMR film, the first TMR film comprising a synthetic anti-ferromagnetic pinned layer having a magnetization direction of a first reference layer orthogonal to a magnetization of a first free layer, a second TMR resistor comprising a second TMR film, the second TMR film comprising a double synthetic anti-ferromagnetic pinned layer having a magnetization direction of a second reference layer orthogonal to a magnetization direction of a second free layer and opposite to the magnetization direction of the first reference layer of the first TMR film, a third TMR resistor comprising the second TMR film, and a fourth TMR resistor comprising the first TMR film, wherein the first and fourth TMR resistors are disposed in a first plane and the second and third TMR resistors are disposed in a second plane different than the first plane.

In another embodiment, a method of fabricating a TMR sensor device comprising a first TMR resistor, a second TMR resistor, a third TMR resistor, and a fourth TMR resistor comprises forming a bottom lead in a first dielectric layer, depositing a first TMR film over the bottom lead and the first dielectric layer, forming the first TMR resistor and the fourth TMR resistor from the first TMR film by patterning the first hard bias and the first device junction and removing one or more first portions of the first TMR film disposed over the first dielectric layer and the bottom lead, forming a plurality of middle leads, depositing a second TMR film over the plurality of middle leads, the second TMR film being different than the first TMR film, forming the second TMR resistor and the third TMR resistor from the second TMR film by patterning the second hard bias and the second device junction and removing one or more second portions of the second TMR film disposed over the middle lead, and forming a plurality of top leads.

In another embodiment, a method of fabricating a TMR sensor device comprises forming a bottom lead, depositing a first TMR film over the bottom lead, the first TMR film comprising a synthetic anti-ferromagnetic pinned layer having a magnetization direction of a first reference layer orthogonal to a magnetization direction of a first free layer, depositing a first photoresist over first portions of the first TMR film disposed on the bottom lead, etching second portions of the first TMR film to expose the bottom lead, depositing the first alumina film and the first hard bias film, removing the first photoresist, depositing a second photoresist over the third portion of the first TMR film and the first hard bias film, etching the fourth portion of the first TMR film and the first hard bias film, refilling with a second dielectric layer, a first TMR resistor and a fourth TMR resistor as fabricated are forming in the same plane.

The method further comprises depositing a first and fourth middle lead over the first TMR resistor and the fourth TMR resistor, and depositing a second and a third middle lead in the area where the second TMR resistor and the third TMR resistor to be fabricated. The method further comprises forming the third dielectric layer adjacent to the first middle lead, the second middle lead, the third middle lead and the fourth middle lead. The method further comprises depositing the second TMR film over the middle lead and the third dielectric layer. The second TMR film comprises a double synthetic anti-ferromagnetic pinned layer having a magnetization direction of a second reference layer orthogonal to a magnetization direction of a second free layer and opposite to the magnetization direction of the first reference layer of the first TMR film.

The method further comprises depositing a third photoresist over first portions of the second TMR film disposed over the second and third middle leads, etching second portions of the second TMR film to expose the second and third middle leads, depositing the second alumina film and the second hard bias film, removing the third photoresist, depositing a fourth photoresist over the third portion of the second TMR film and the second hard bias film, etching the fourth portion of the second TMR film and the second hard bias film, refilling with a fourth dielectric layer, the second TMR resistor and the third TMR resistor are fabricated in the same plane but different to the plane of the first TMR resistor and the fourth TMR resistor, and forming a first top lead over the first middle lead, a fourth top lead over the fourth middle lead, and the second top lead over the second TMR resistor, a third top lead over the third TMR resistor.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 6A-6H illustrate a corresponding schematic of depositing a first TMR film to function as a first resistor and a fourth resistor and a second TMR film to function as a second resistor and a third resistor of a TMR sensor device or Wheatstone bridge array, according to another embodiment.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

A TMR sensor device is disclosed that includes one or more TMR resistors. The TMR sensor device comprises a first TMR resistor comprising a first TMR film, a second TMR resistor comprising a second TMR film different than the first TMR film, a third TMR resistor comprising the second TMR film, and a fourth TMR resistor comprising the first TMR film. The first and fourth TMR resistors are disposed in a first plane while the second and third TMR resistors are disposed in a second plane different than the first plane. The first TMR film comprises a synthetic anti-ferromagnetic pinned layer having a magnetization direction of a reference layer orthogonal to a magnetization direction a free layer. The second TMR film comprises a double synthetic anti-ferromagnetic pinned layer having a magnetization direction of a reference layer orthogonal to a magnetization direction of a free layer.

Figure 1:
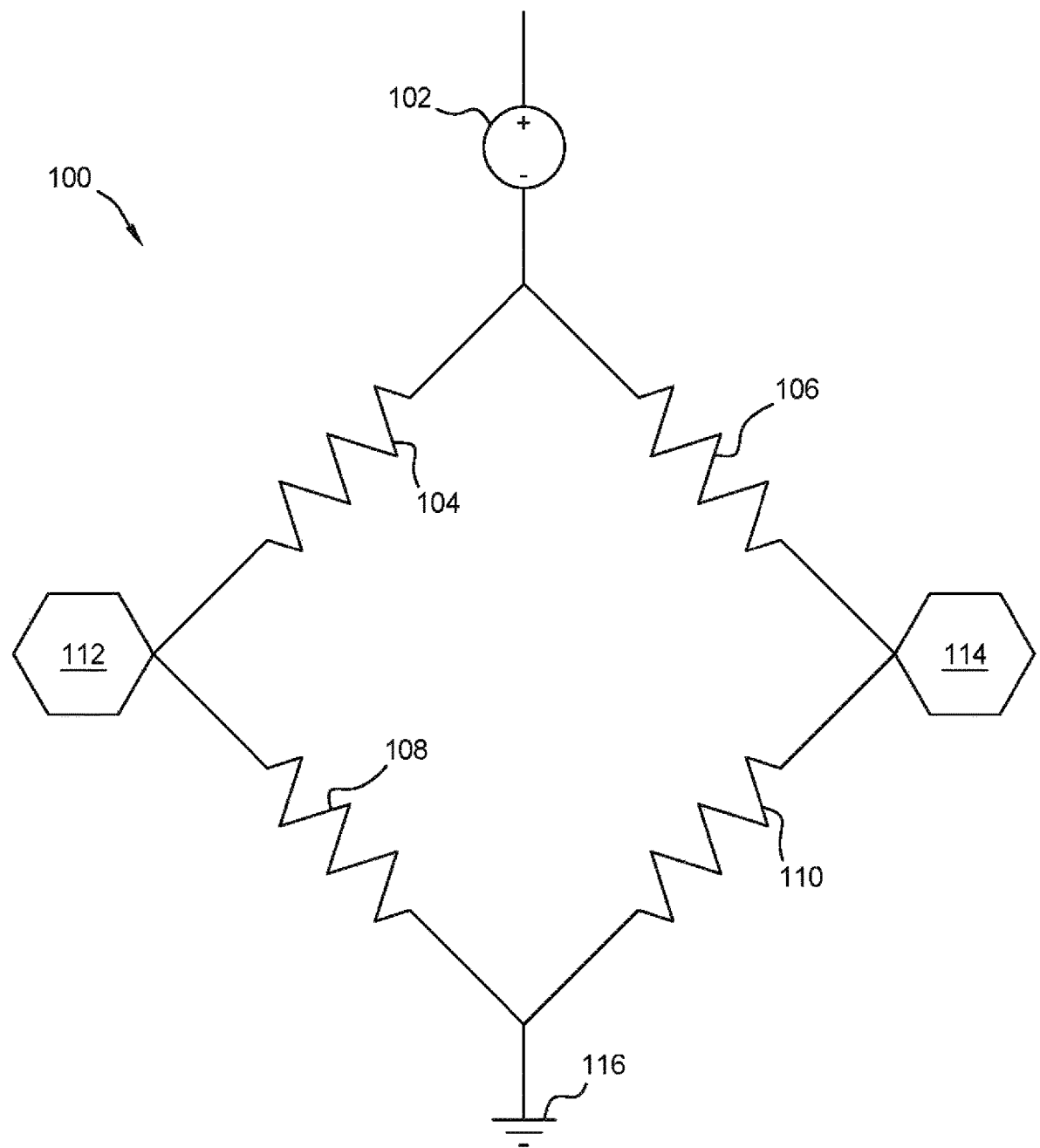
FIG. 1 is a schematic illustration of a TMR sensor device or Wheatstone bridge design.

FIG. 1 is a schematic illustration of a TMR sensor device 100 design, such as a Wheatstone bridge. The TMR sensor device 100 includes a bias source 102, a first resistor 104, a second resistor 106, a third resistor 108, a fourth resistor 110, a first output pad 112, a second output pad 114, and a ground connection 116. The resistors 104, 106, 108, 110 are formed by patterning TMR films. The resistors 104, 106, 108, 110 are formed by magnetic sensors. Bias voltage is applied across the TMR sensor device 100 or bridge from the bias source 102 to the ground connection 116. The bridge output is the potential difference across the first output pad 112 and the second output pad 114. Any change in resistance due to temperature variation from the resistors 104, 106, 108, 110 is nullified due to the nature of the differential output.

As discussed herein, each of the resistors 104, 106, 108, 110 is made of a TMR film. In one embodiment, the TMR resistors are each distinct and different such that the resistors 104, 106, 108, 110 have different resistance. In another embodiment, the TMR films are identical, but the resistors 104, 106, 108, 110 are different. In still another embodiment, resistors 104, 110 are identical to each other (as are the TMR films that form the resistors 104, 110), and resistors 106, 108 are identical to each other (as are the TMR films that form the resistors 106, 108) yet different than resistors 104, 110.

Figure 2:
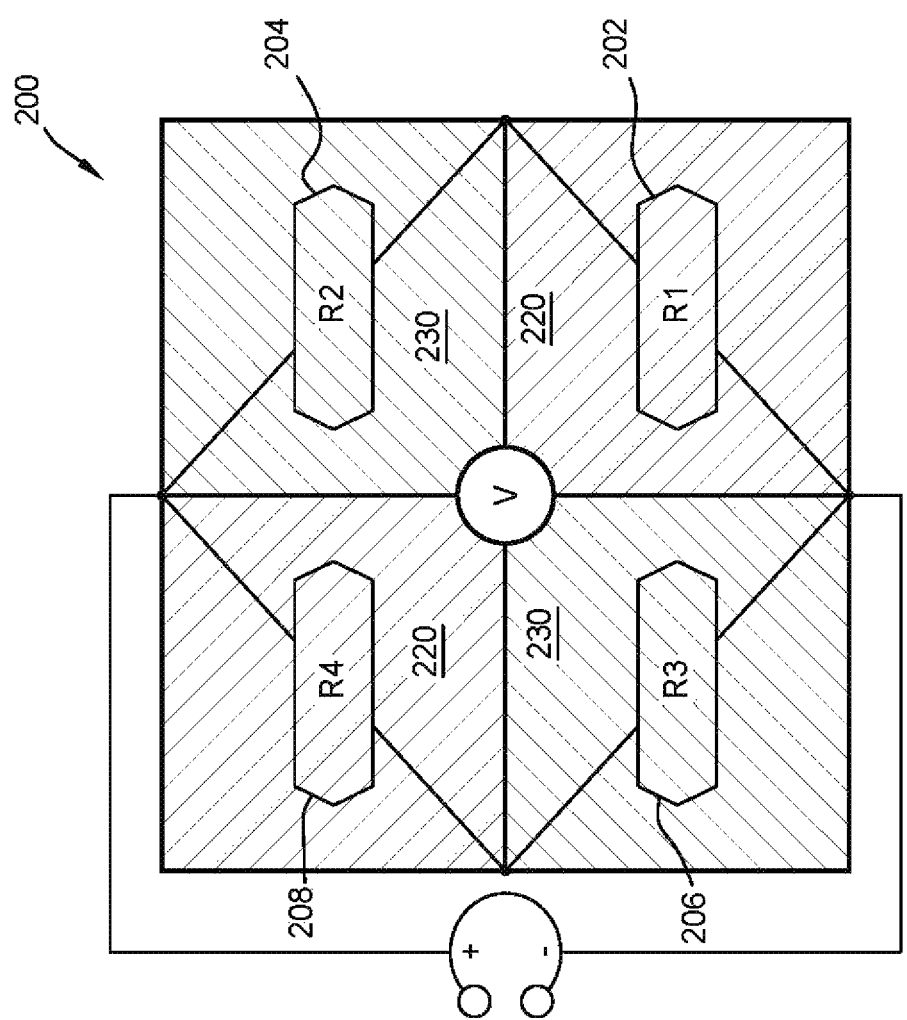
FIG. 2 is a schematic view illustrating a first TMR film and a second TMR film used to form resistors of a TMR sensor device or Wheatstone bridge, according to one embodiment.

FIG. 2 is a schematic view illustrating a first TMR film 220, or film A, and a second TMR film 230, or film B, used to form the resistors 202, 204, 206, 208 of a TMR sensor device 200, such as a TMR based magnetic sensor or Wheatstone bridge array, according to one embodiment. The TMR sensor device 200 may be the TMR sensor device 100 of FIG. 1.

As shown in FIG. 2, a first resistor R1 202 and a fourth resistor R4 208 both comprise the first TMR film 220 while a second resistor R2 204 and a third resistor R3 206 both comprise the second TMR film 230. The TMR resistance of the first and fourth resistors R1/R4 202, 208 formed of the first TMR film 220 increase with an external magnetic field while the TMR resistance of the second and third resistors R2/R3 204, 206 formed of the second TMR film 230 decrease with an external magnetic field. Alternatively, the TMR resistance of the first and fourth resistors R1/R4 202, 208 formed of the first TMR film 220 may decrease with an external magnetic field while the TMR resistance of the second and third resistors R2/R3 204, 206 formed of the second TMR film 230 may increase with an external magnetic field. As such, the two different TMR films 220, 230 provide two different magnetoresistance responses.

Figure 3:
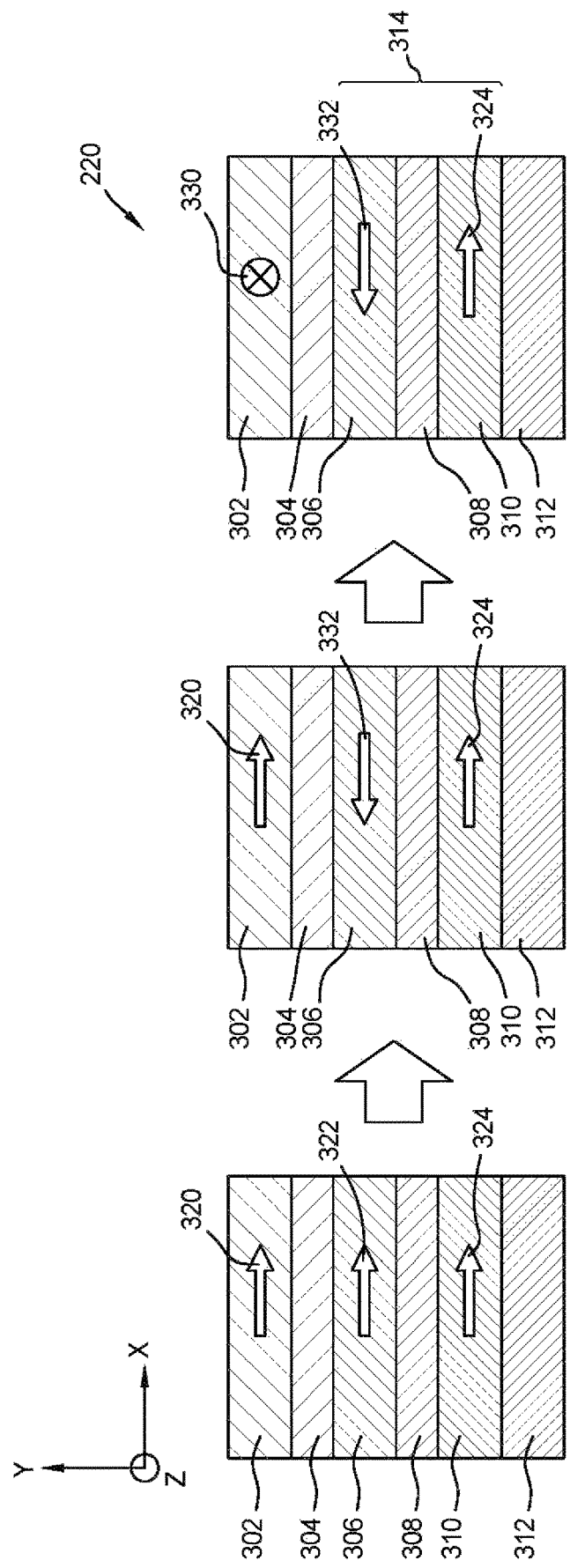
FIGS. 3A-3C illustrate a first TMR film, or TMR film A, in various stages of formation, according to one embodiment.

FIGS. 3A-3C illustrate the first TMR film 220 of FIG. 2, or film A, in various stages of formation, according to one embodiment. FIG. 3A illustrates the first TMR film 220 during a magnetic anneal, FIG. 3B illustrates the first TMR film 220 post magnetic anneal, and FIG. 3C illustrates the first TMR film 220 after the FL magnetization direction has been reset upon completion of the TMR sensor device or Wheatstone bridge fabrication. The first TMR film 220 may function as magnetic sensors.

In FIGS. 3A-3C, the first TMR film 220 comprises a free layer 302, a barrier layer 304 disposed below the free layer 302, a reference layer (RL) 306 disposed below the barrier layer 304, a spacer layer 308 disposed below the RL 306, a pinned layer (PL) 310 disposed below the spacer layer 308, and an antiferromagnet (AFM) layer 312 disposed below the PL 310.

The FL 302 may comprise a CoFe/CoFeB/Ta/NiFe multilayer stack. Suitable materials for the free layer 302 include a CoFe/CoFeB/Ta/NiFe multilayer stack. The CoFe layer may have a thickness of between about 3 Angstroms to about 10 Angstroms. The CoFeB layer may have a thickness of between about 10 Angstroms to about 20 Angstroms. The Ta layer may have a thickness of between about 0.5 Angstroms to about 2 Angstroms. The NiFe layer may have a thickness of between about 3 Angstroms to about 300 Angstroms, such as between about 3 Angstroms and about 10 Angstroms or between about 10 Angstroms and about 300 Angstroms. The free layer 302 may be formed by well-known deposition methods such as sputtering. Additionally, it is to be understood that while CoFe/CoFeB/Ta/NiFe has been exemplified as the free layer 302 material, other materials are contemplated and the embodiments discussed herein are not limited to CoFe/CoFeB/Ta/NiFe for the free layer 302.

The barrier layer 304 may comprise MgO and may have a thickness of between about 10 Angstroms to about 20 Angstroms. It is to be understood that while MgO is exemplified as the barrier layer 304, other insulating materials as contemplated. The spacer layer 308 comprises a non-magnetic material, such as Ru. The spacer layer 308 may have a thickness of between about 4 Angstroms to about 10 Angstroms. The spacer layer 308 may be formed by well-known deposition methods such as sputtering. Additionally, it is to be understood that while ruthenium has been exemplified as the spacer layer 308 material, other materials are contemplated and the embodiments discussed herein are not limited to ruthenium for the spacer layer 308.

Suitable materials for the reference layer 306 and the pinned layer 310 include CoFe or a Co/CoFe/Co multi-layer stack with a thickness of between about 20 Angstroms and about 30 Angstroms. The reference layer 306 and the pinned layer 310 may be formed by well-known deposition methods such as sputtering. The reference layer 306 and the pinned layer 310 can each include a CoFe/Ta/CoFeB/CoFe multi-layer. Additionally, it is to be understood that while CoFe or Co/CoFe/Co have been exemplified as the reference layer 306 and the pinned layer 310 material, other materials are contemplated and the embodiments discussed herein are not limited to CoFe or Co/CoFe/Co for the reference layer 306 and the pinned layer 310.

Suitable materials for the AFM layer 312 include IrMn, PtMn, PdMn, or NiMn at a thickness of between about 40 Angstroms to about 500 Angstroms. The AFM layer 312 may be formed by well-known deposition methods such as sputtering. Additionally, it is to be understood that while IrMn, PtMn, PdMn, and NiMn have been exemplified as the AFM layer 312 materials, other materials are contemplated and the embodiments discussed herein are not limited to IrMn, PtMn, PdMn, or NiMn for the AFM layer 312.

In FIG. 3A, the FL 302 has a first magnetization direction 320 pointing in the x-direction, the RL 306 has a first magnetization direction 322 pointing in the x-direction, and the PL 310 has a first magnetization direction 324 pointing in the x-direction during magnetic annealing under a magnetic field applied along the x-direction.

In FIG. 3B, the FL 302 has the first magnetization direction 320 pointing in the x-direction, the RL 306 has a second magnetization direction 332 pointing in the −x-direction due to the Ruderman-Kittel-Kasuya-Yosida (RKKY) interlayer exchange coupling effect while the PL 310 has the first magnetization direction 324 pointing in the x-direction. Thus, post magnetic annealing, the FL 302 and the PL 310 have parallel magnetization directions 320, 324 while the RL 306 has an anti-parallel magnetization direction 332.

In FIG. 3C, the FL 302 has a second magnetization direction 330 pointing in the −z-direction (i.e., into the page), the RL 306 has the second magnetization direction 332 pointing in the −x-direction, and the PL 310 has a first magnetization direction 324 pointing in the x-direction. Thus, after the FL magnetization direction has been reset upon completion of the TMR sensor device or Wheatstone bridge fabrication, the FL 302 has an orthogonal magnetization direction 330 to that of the RL 306 and the PL 310 while the RL 306 has a magnetization direction 332 anti-parallel to the PL 310 magnetization direction 324. The magnetization direction 330 of the FL 302 may be reset by applying an additional magnetic field like hard bias by a permanent magnet around the FL 302 or exchange bias by an AFM on top of the FL 302.

FIG. 3C illustrates the first TMR film 220 used in the TMR sensor device 200 of FIG. 2. As further shown in FIG. 3C, the RL 306 and the PL 310 form a synthetic anti-ferromagnetic (SAF) pinned layer 314.

Figure 4:
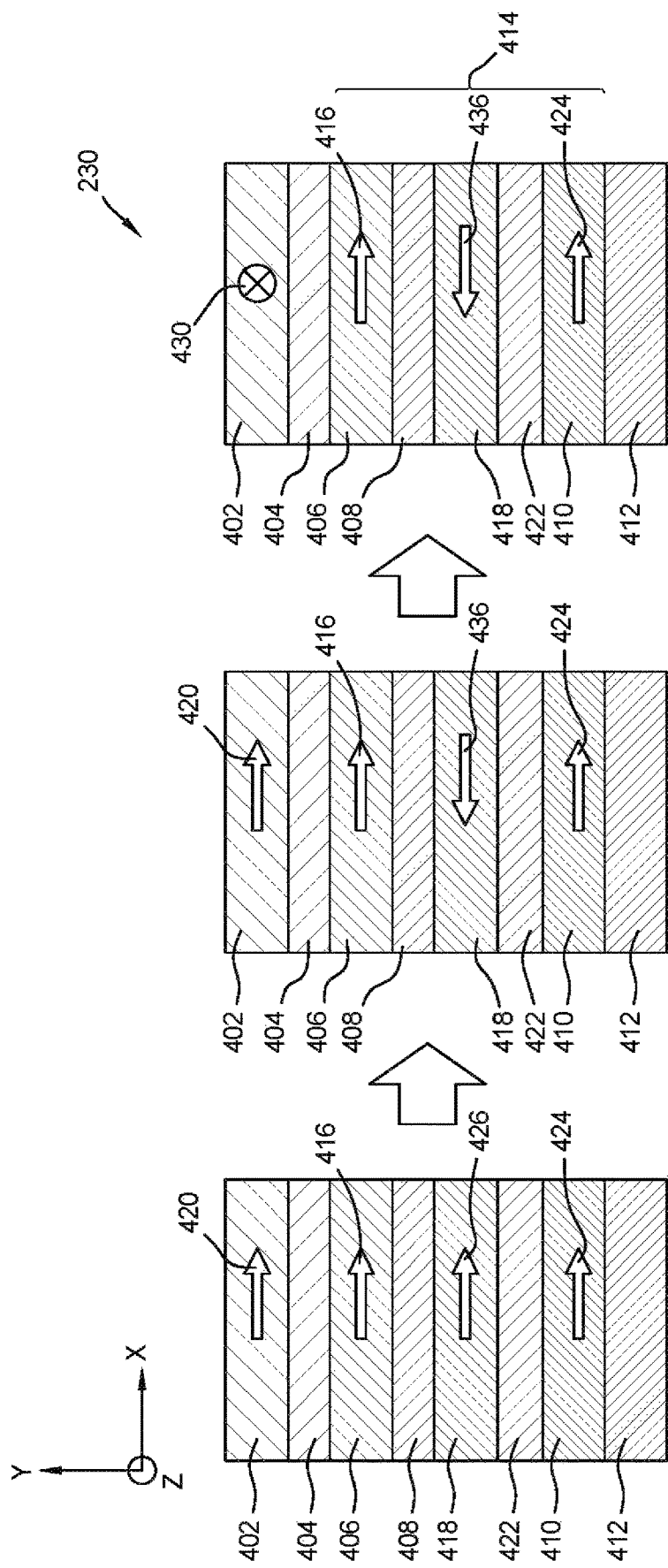
FIGS. 4A-4C illustrate a second TMR film, or TMR film B, in various stages of formation, according to another embodiment.

FIGS. 4A-4C illustrate the second TMR film 230 of FIG. 2, or film B, in various stages of formation, according to one embodiment. FIG. 4A illustrates the second TMR film 230 during a magnetic anneal, FIG. 4B illustrates the second TMR film 230 post magnetic anneal, and FIG. 4C illustrates the second TMR film 230 after the FL magnetization direction has been reset upon completion of the TMR sensor device or Wheatstone bridge fabrication. The second TMR film 230 may function as magnetic sensors.

In FIGS. 4A-4C, the second TMR film 230 comprises a free layer 402, a barrier layer 404 disposed below the free layer 402, a reference layer (RL) 406 disposed below the barrier layer 404, a first spacer layer 408 disposed below the RL 406, a first pinned layer (PL') 418 disposed below the first spacer layer 408, a second spacer layer 422 disposed below the first PL' 418, a second pinned layer (PL") 410 disposed below the second spacer layer 422, and an AFM layer 412 disposed below the second PL" 410.

The FL 402 may comprise a CoFe/CoFeB/Ta/NiFe multilayer stack. Suitable materials for the free layer 402 include a CoFe/CoFeB/Ta/NiFe multilayer stack. The CoFe layer may have a thickness of between about 3 Angstroms to about 10 Angstroms. The CoFeB layer may have a thickness of between about 10 Angstroms to about 20 Angstroms. The Ta layer may have a thickness of between about 0.5 Angstroms to about 2 Angstroms. The NiFe layer may have a thickness of between about 3 Angstroms to about 300 Angstroms, such as between about 3 Angstroms and about 10 Angstroms or between about 10 Angstroms and about 300 Angstroms. The free layer 402 may be formed by well-known deposition methods such as sputtering. Additionally, it is to be understood that while CoFe/CoFeB/Ta/NiFe has been exemplified as the free layer 402 material, other materials are contemplated and the embodiments discussed herein are not limited to CoFe/CoFeB/Ta/NiFe for the free layer 402.

The barrier layer 404 may comprise MgO and may have a thickness of between about 10 Angstroms to about 20 Angstroms. It is to be understood that while MgO is exemplified as the barrier layer 404, other insulating materials as contemplated. The first and second spacer layers 408, 422 may each comprise a non-magnetic material, such as Ru. The first and second spacer layers 408, 422 may each have a thickness of between about 4 Angstroms to about 10 Angstroms. The first and second spacer layers 408, 422 may be formed by well-known deposition methods such as sputtering. Additionally, it is to be understood that while ruthenium has been exemplified as the first and second spacer layers 408, 422 material, other materials are contemplated and the embodiments discussed herein are not limited to ruthenium for the first and second spacer layers 408, 422.

Suitable materials for the reference layer 406 and the first and second pinned layers 410, 418 include CoFe or a Co/CoFe/Co multi-layer stack with a thickness of between about 20 Angstroms and about 30 Angstroms. The reference layer 406 and the first and second pinned layers 410, 418 may be formed by well-known deposition methods such as sputtering. The reference layer 406 can include a CoFe/Ta/CoFeB/CoFe multilayer. Additionally, it is to be understood that while CoFe or Co/CoFe/Co have been exemplified as the reference layer 406 and the first and second pinned layers 410, 418 material, other materials are contemplated and the embodiments discussed herein are not limited to CoFe or Co/CoFe/Co for the reference layer 406 and the first and second pinned layers 410, 418.

Suitable materials for the AFM layer 412 include IrMn, PtMn, PdMn, or NiMn at a thickness of between about 40 Angstroms to about 500 Angstroms. The AFM layer 412 may be formed by well-known deposition methods such as sputtering. Additionally, it is to be understood that while IrMn, PtMn, PdMn, and NiMn have been exemplified as the AFM layer 412 materials, other materials are contemplated and the embodiments discussed herein are not limited to IrMn, PtMn, PdMn, or NiMn for the AFM layer 412.

In FIG. 4A, the FL 402 has a first magnetization direction 420 pointing in the x-direction, the RL 406 has a first magnetization direction 416 pointing in the x-direction, the second PL" 410 has a first magnetization direction 424 pointing in the x-direction, and the first PL' 418 has a first magnetization direction 426 pointing in the x-direction during magnetic annealing under a magnetic field applied along x-direction. Thus, in the second TMR film 230 the magnetization directions of the FL 402, the RL 406, the second PL" 410, and the first PL' 418 parallel to one another.

In FIG. 4B, the FL 402 has the first magnetization direction 420 pointing in the x-direction, the RL 406 has the first magnetization direction 416 pointing in the x-direction, the second PL" 410 has the first magnetization direction 424 pointing in the x-direction, and the first PL' 418 has a second magnetization direction 436 pointing in the −x-direction due to the RKKY interlayer exchange coupling effect. The second PL" 410 disposed adjacent to the AFM 412 has a magnetization direction 424 parallel to the annealing magnetic field due setting the AFM exchange bias or unidirectional anisotropy direction. Thus, post magnetic annealing, the FL 402, the RL 406, and the second PL" 410 have parallel magnetization directions 420, 416, 424 while the first PL' 418 has an anti-parallel magnetization direction 436.

In FIG. 4C, the FL 402 has a second magnetization direction 430 pointing in the −z-direction (i.e., into the page), the RL 406 has the first magnetization direction 416 pointing in the x-direction, the second PL" 410 has a first magnetization direction 424 pointing in the x-direction, and the first PL' 418 has the second magnetization 436 pointing in the −x-direction. Thus, after the FL magnetization direction has been reset upon completion of the TMR sensor device or Wheatstone bridge fabrication, the FL 402 has an orthogonal magnetization direction 430 to that of the RL 406 and the second PL" 410, while the first PL' 418 has a magnetization direction 436 anti-parallel to that of the RL 406 and the second PL" 410. The magnetization direction 430 of the FL 402 may be reset by applying an additional magnetic field like hard bias by a permanent magnetic around the FL 402 or the exchange bias by an AFM on top of the FL 402.

FIG. 4C illustrates the second TMR film 230 used in the TMR sensor device 200 of FIG. 2. As further shown in FIG. 4C, the RL 406, the second PL" 410, and the first PL' 418 form a double SAF pinned layer 414. Because the first TMR film 220 and the second TMR film 230 have different PL magnetization directions, the TMR resistance response of each film has the same amplitude but in opposite sense (i.e., the resistance of one film increases with increasing magnetic field while the resistance of the other film decreases, or vice versa). As such, the TMR sensor device or Wheatstone bridge characteristic differential output is realized and fulfilled with maximum efficiency since the full range of magnetoresistance range is available, accomplishing maximum output voltage or sensitivity.

Figure 5:
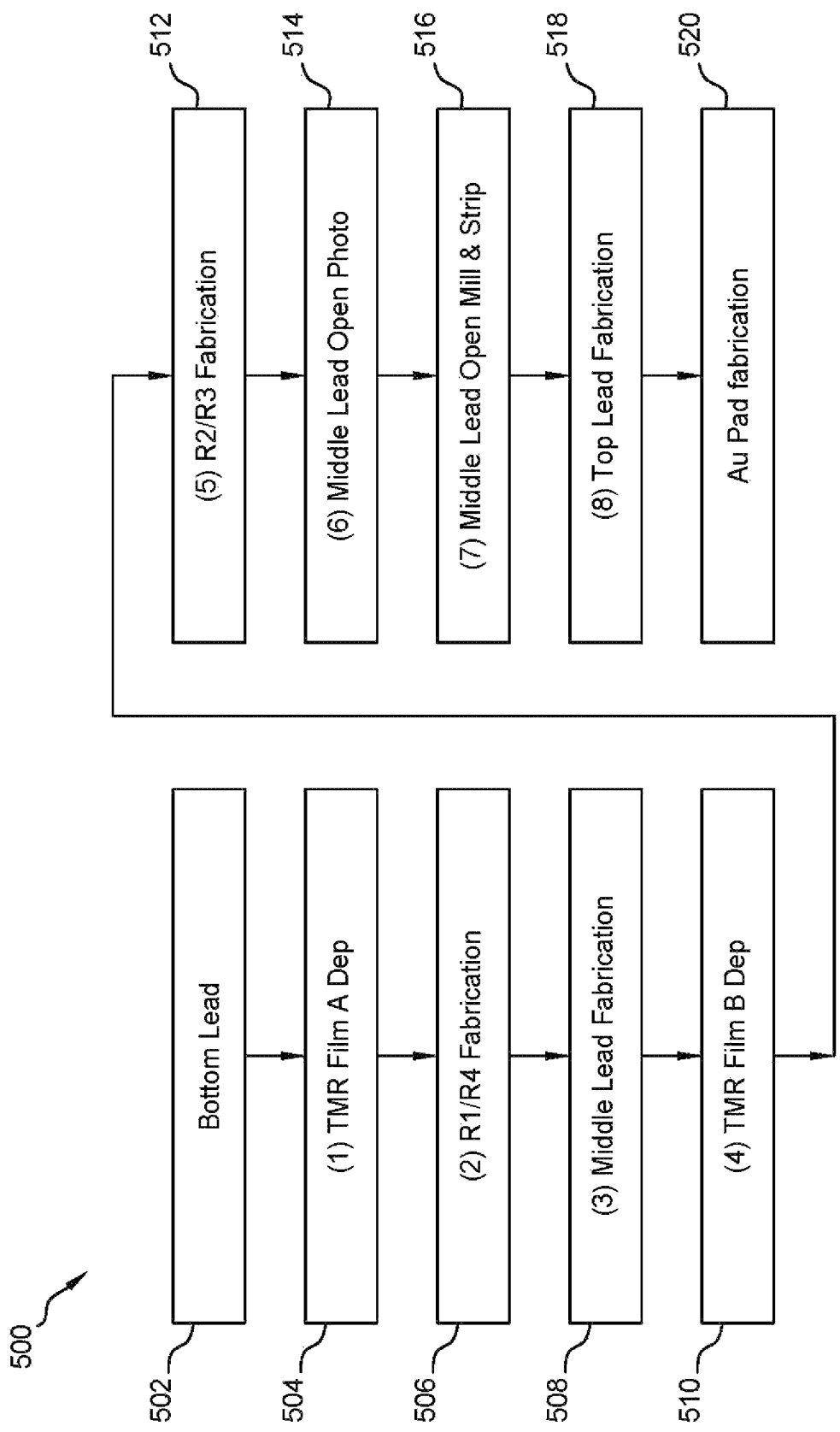
FIG. 5 illustrates a method of forming a TMR sensor device or Wheatstone bridge, according to one embodiment.

FIG. 5 illustrates a method 500 of forming a TMR sensor device (i.e., a TMR magnetic sensor or Wheatstone bridge) by depositing a first film to function as a first resistor and a fourth resistor and a second film to function as a second resistor and a third resistor, according to embodiments disclosed herein. Method 500 may be used to form the TMR sensor device 200 of FIG. 2. FIGS. 6A-6H illustrate a corresponding schematic of depositing a first TMR film 610 to function as a first resistor and a fourth resistor and a second TMR film 620 to function as a second resistor and a third resistor of a TMR sensor device (i.e., a TMR magnetic sensor or Wheatstone bridge). FIG. 5 will be described with reference to FIGS. 6A-6H.

In operation 502, one or more bottom leads 604 (a first bottom lead is shown) and a first dielectric layer 606 are formed over a substrate 602, and a chemical-mechanical planarization (CMP) stop layer 608 is deposited on the first dielectric layer 606. The one or more bottom leads 604 may undergo a CMP process to reduce a surface roughness of the bottom leads 604.

In one embodiment, two bottom leads 604 are formed. In such an embodiment, a second bottom lead (not shown) may be disposed behind the first bottom lead 604 in the z-direction and offset from the first bottom lead 604 in the x-direction. While only a first bottom lead 604 is shown, one or more bottom leads 604 may be included.

In operation 504, a first TMR film 610, or TMR film A, is deposited over the one or more bottom leads 604 and the first CMP stop layer 608 as shown as a single layer, in FIG. 6A. The first TMR film 610 comprises a plurality of layers. In some embodiments, the first TMR film 610 is the first TMR film 220 of FIGS. 2 and 3C. The first TMR film 610 comprises a synthetic anti-ferromagnetic pinned layer having a magnetization direction of a reference layer orthogonal to a magnetization direction of a free layer.

In operation 506, the first TMR film 610 is milled such that the first TMR layer 610 is disposed on the first bottom lead 604 and a second bottom lead (not shown) to form a first resistor (R1) and a fourth resistor (R4), collectively referred to as R1/R4 612, and a second dielectric layer 612 is deposited, as shown in FIG. 6B. After etching, the first TMR layer 610 has a length in the x-direction less than a length of each of the one or more bottom leads 604. To etch the first TMR film 610, a first photoresist 630 is deposited over first portions 632 of the first TMR film 610 aligned with the one or more bottom leads 604. The first photoresist 630 may be deposited as a single layer, and the section of the first photoresist 630 disposed outside the first portions 632 is then removed. The length and width of the first photoresist 630 in the x-direction and z-direction is selected to define the length and width of the first and fourth resistors R1/R4 612 in the x-direction and z-direction. The first photoresist 630 has a width less than each of the one or more bottom lead 604.

The first TMR film 610 disposed outside the first portions 632 is milled with accurate control to remove any excess first TMR film 610 without removing the second dielectric layer 616. The remaining first TMR film 610 disposed in the first portions 632 is protected by the first photoresist 630. The remaining first TMR film 610 forms the first and fourth resistors R1/R4 612. The first and fourth resistors R1/R4 612 may be the first resistor 104 and the fourth resistor 110 of FIG. 1, respectively, or the first resistor 202 and the fourth resistor 208 of FIG. 2, respectively. The second dielectric layer 616 is then refilled or deposited around the remaining first TMR film 610. The first photoresist 630 is then stripped away and removed. The first and fourth resistors R1/R4 612 have the same length and width as the first photoresist 630 in the x-direction and z-direction.

In operation 508, one or more middle leads 614 (a first middle lead 614a and a second middle lead 614b are shown) are fabricated over the first and fourth resistors R1/R4 612 and over the second dielectric layer 616. The first middle lead 614a and a fourth middle lead (not shown) form the top lead for the first and fourth resistor R1/R4 612 while the second middle lead 614b and a third middle lead form the bottom lead for a second and third resistor (R2/R3) (described and shown in FIGS. 6E-6H).

In one embodiment, four middle leads 614 are formed. In such an embodiment, a third middle lead (not shown) may be disposed behind the first middle lead 614a in the z-direction, and a fourth middle lead (not shown) may be disposed behind the second middle lead 614b in the z-direction. The fourth middle lead (not shown) forms the top lead for the first or fourth resistor R1/R4 612 while the third middle lead (not shown) forms the bottom lead for a second or third resistor (R2/R3). While only a first middle lead 614a and a second middle lead 614b are shown, one or more middle leads 614 may be included.

To form the middle leads 614, the middle leads 614 are first deposited as a single layer and a second photoresist 642 is deposited above second portions 644 and third portions 646 spaced from the second portions 644. The second photoresist 642 may be deposited as a single layer, and the section of the second photoresist 642 disposed outside the second and third portions 644, 646 are then removed. The length and width of the second photoresist 642 in the x-direction and z-direction is selected to define the length and width of the middle leads 614 in the x-direction and z-direction. The second portions 644 are disposed above the first and fourth resistors R1/R4 612 while the third portions 646 are aligned with where the second and third resistors R2/R3 will be formed (described and shown in FIGS. 6E-6H).

The middle lead layer is then milled with accurate control such that the portion of the middle lead layer disposed outside the second and third portions 644, 646 is removed. The second dielectric layer 616 is then refilled such that the second dielectric layer 616 has the same thickness and width in the y-direction and z-direction as the middle leads 614. A second CMP stop layer 618 is then deposited on the second dielectric layer 616 and the second photoresist 642 is removed. The one or more middle leads 614 may undergo a CMP process to reduce a surface roughness of the middle leads 614.

Figure 6C:
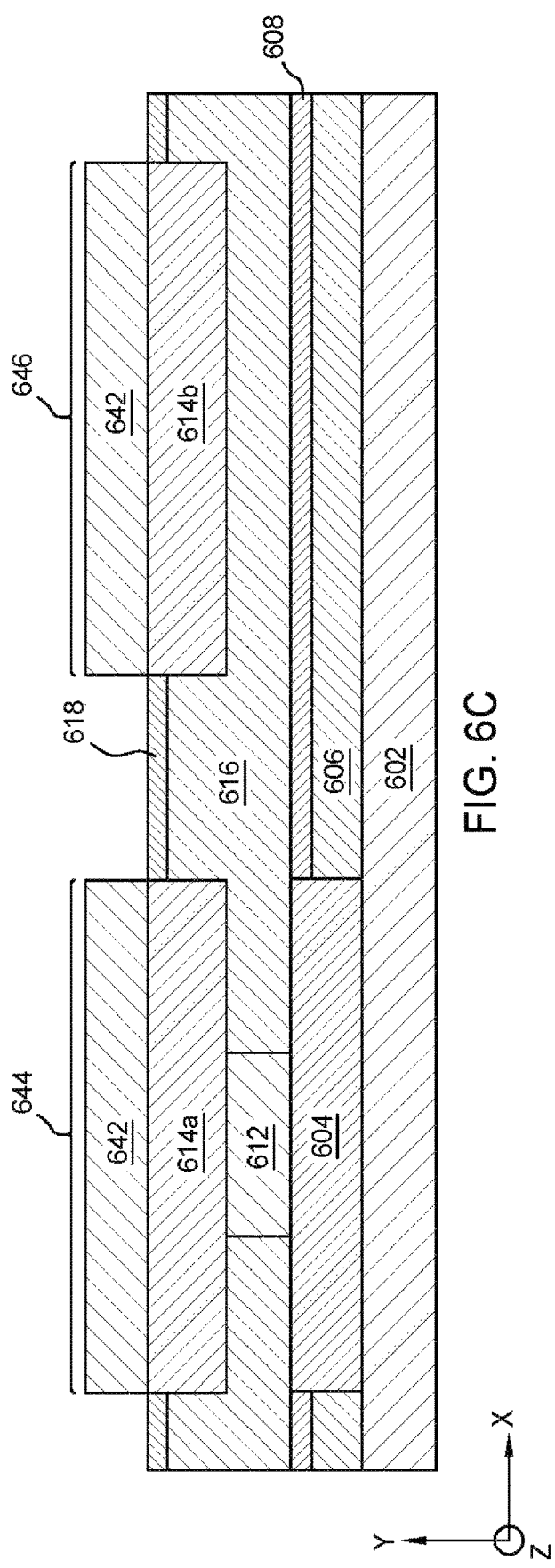
Figure 6D:
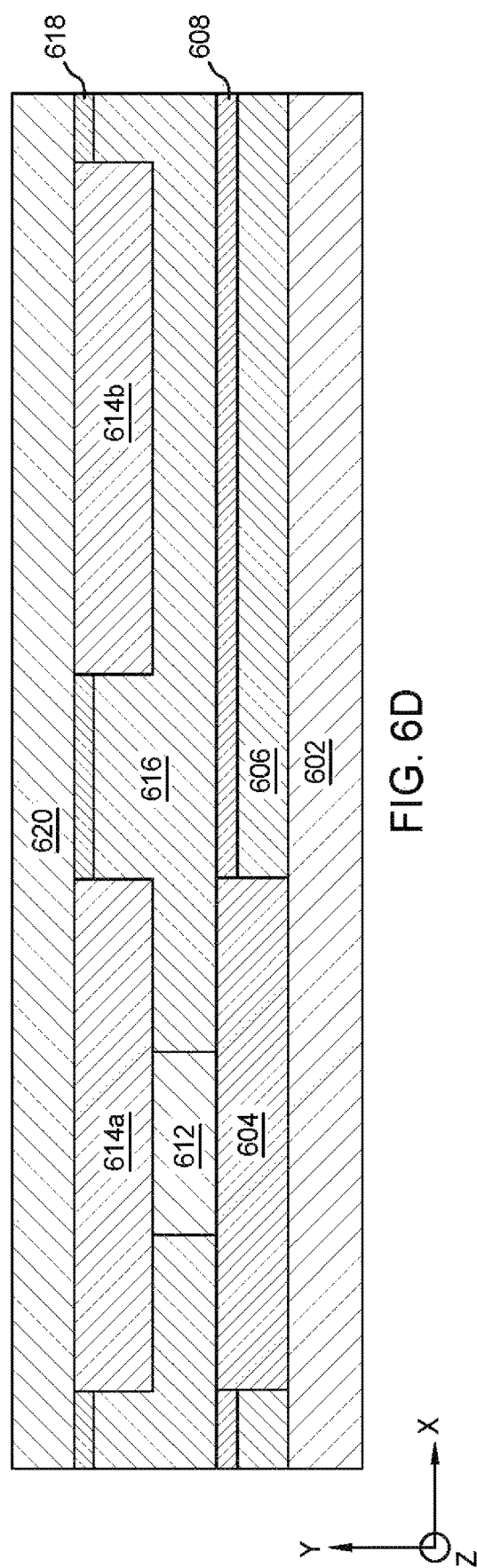

In operation 510, a second TMR film 620, or TMR film B, is deposited over the middle leads 614 and the second CMP stop layer 618, as shown as a single layer in FIG. 6D. The second TMR film 620 comprises a plurality of layers. In some embodiments, the second TMR film 620 is the second TMR film 230 of FIGS. 2 and 4C. The second TMR film 620 comprises a double synthetic anti-ferromagnetic pinned layer having a magnetization direction of a reference layer orthogonal to a magnetization direction a free layer and opposite to the magnetization direction of the reference layer of the first TMR film 610.

Figure 6E:
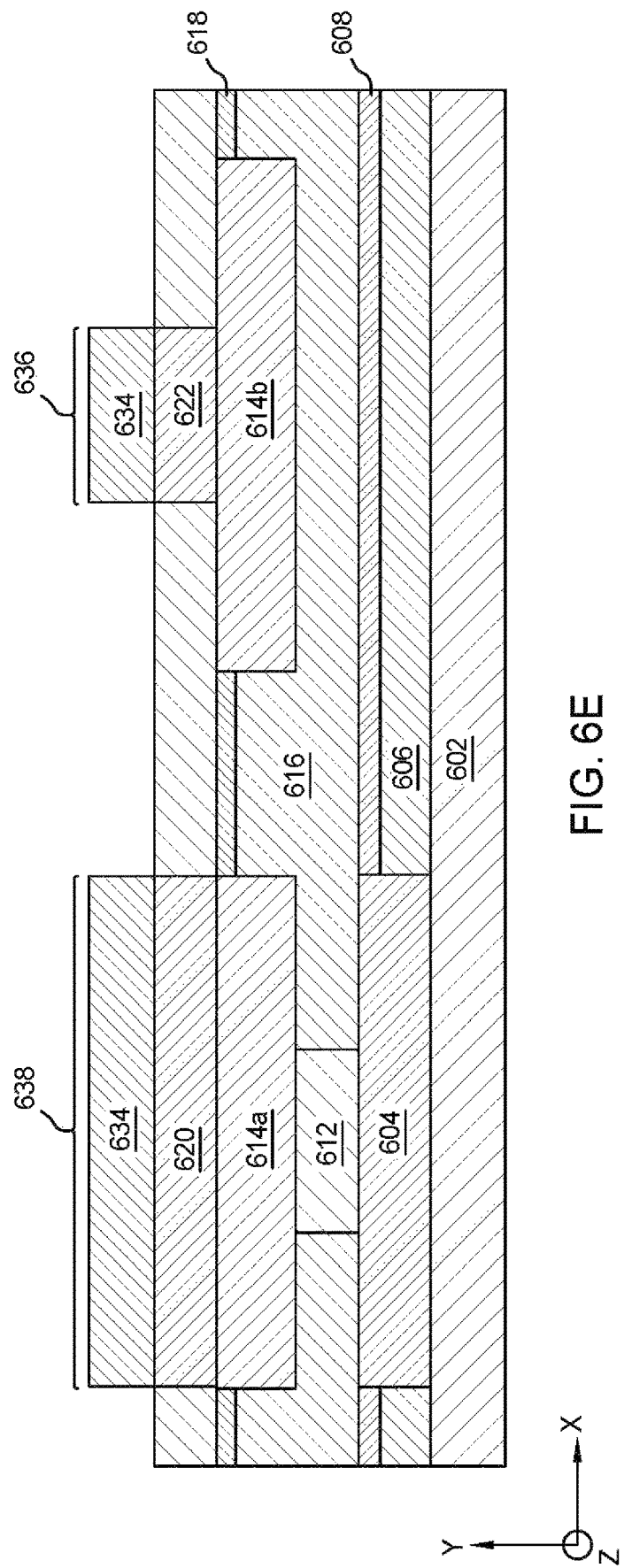
Figure 6F:
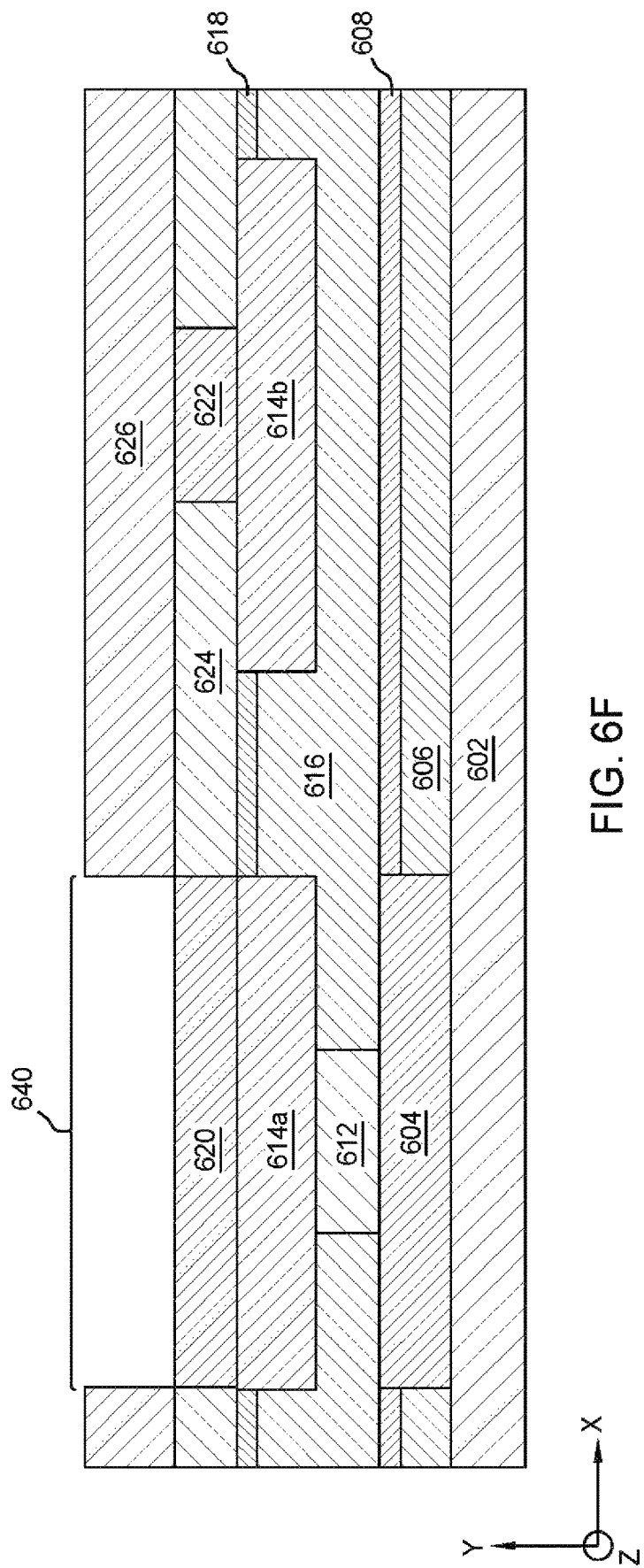
Figure 6G:
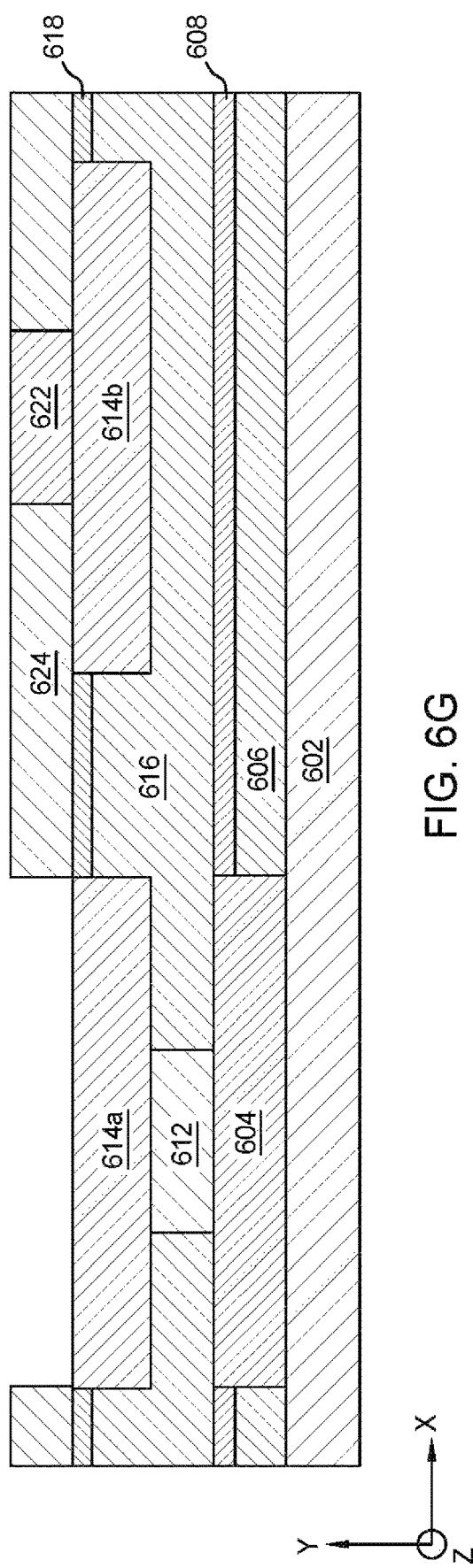
Figure 6H:
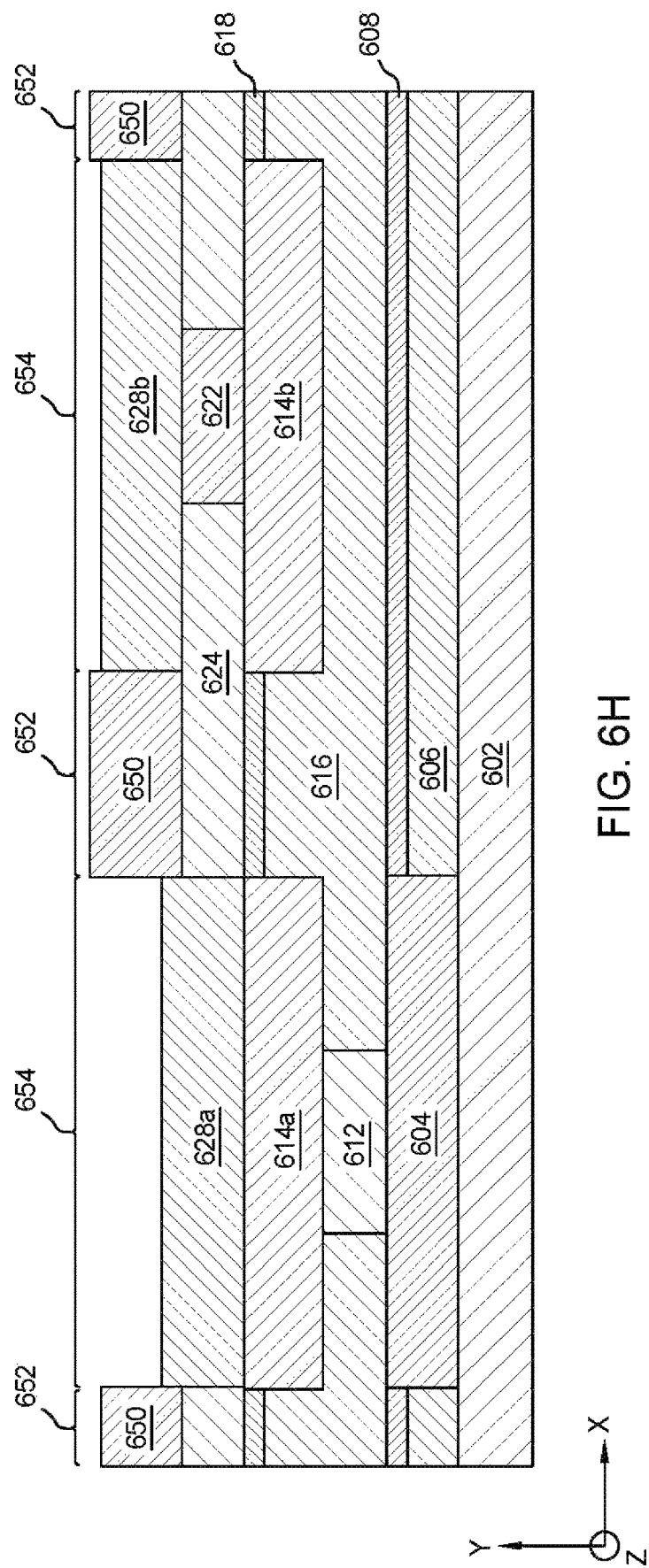

In operation 512, the second TMR film 620 is milled with accurate control such that the second TMR film 620 is disposed on the second middle lead 614b and a third middle lead (not shown) to form a second resistor (R2) and a third resistor (R3), collectively referred to as R2/R3 622, and a third dielectric layer 624 is deposited, as shown in FIG. 6E. The second and third resistors R2/R3 624 may be the second resistor 106 and the third resistor 108 of FIG. 1, respectively, or the second resistor 204 and the third resistor 206 of FIG. 2, respectively. The second TMR film 620 has a length in the x-direction less than a length of the second middle lead 614b. To etch second TMR film 620, a third photoresist 634 is deposited over fourth portions 636 and fifth portions 638 of the second TMR film 620. The third photoresist 634 may be deposited as a single layer, and the section of the third photoresist 634 disposed outside the fourth and fifth portions 636, 638 are then removed.

The length and width of the third photoresist 634 in the fourth portions 636 in the x-direction and z-direction are selected to define the length and width of the second and third resistors R2/R3 622 in the x-direction and z-direction.

The fourth portions 636 are disposed above the second middle lead 614b and a third middle lead (not shown) while the fifth portions 638 are disposed on the first middle lead 614a and a fourth middle lead (not shown). The third photoresist 634 in the fourth portions 636 has a width less than the second middle lead 614b. The second middle lead 614b and the third middle lead act as a bottom lead for the second and third resistor R2/R3 622.

The second TMR film 620 disposed outside the fourth portions 636 and the fifth portions 638 is milled and etched away to remove any excess second TMR film 620. The remaining second TMR film 620 disposed in the fourth portions 636 and the fifth portions 638 is protected by the third photoresist 634. The remaining second TMR film 620 disposed in the fourth portions 636 form the second and third resistors R2/R3 622. The third dielectric layer 624 is then deposited around the third photoresist 634. The third photoresist 634 is then stripped away and removed. The second and third resistors R2/R3 622 have the same length and width as the third photoresist 634 in the x-direction and z-direction.

In one embodiment, the second TMR film 620 is deposited in operation 504 to form the first and fourth resistors R1/R4 612, and the first TMR film 610 is deposited in operation 510 to form the second and third resistors R2/R3 622.

In operation 514, sixth portions 640 disposed above the first middle lead 614a and the fourth middle lead are opened by depositing a fourth photoresist 626 over the second and third resistors R2/R3 622 and on the third dielectric layer 624 disposed outside the sixth portion 640 (i.e., the fourth photoresist 626 is deposited on the entire surface except within the sixth portions 640. The fourth photoresist 626 may be deposited as a single layer, and the section of the fourth photoresist 626 disposed in the sixth portions 640 is then removed.

In operation 516, the portion of the second TMR film 620 disposed on the first middle lead 614a and fourth middle lead is milled and etched, and the fourth photoresist 626 is stripped and removed. Thus, the second and third resistors R2/R3 622 are the only remaining portion of the second TMR film 620. The second and third resistors R2/R3 622 are unaligned with the first and fourth resistors R1/R4 612 in both the y-direction and the x-direction. As such, the second and third resistors R2/R3 622 are disposed in a different plane than the first and fourth resistors R1/R4 612. The plane of the second and third resistors R2/R3 622 is disposed higher in the y-direction than the plane of the first and fourth resistors R1/R4 612 by the height of the middle leads 614. The second and third resistors R2/R3 622 may have the same length, width, and height in the x-direction, y-direction, and z-direction as the first and fourth resistors R1/R4 612.

In operation 518, one or more top leads 628 are fabricated over R1/R4 612 and R2/R3 622. For example, a first top lead 628a and a fourth top lead are fabricated over the first and fourth resistors R1/R4 612 on the first middle lead 614a and the fourth middle lead, and a second top lead 628b and a third top lead are fabricated on the second and third resistor R2/R3 622. In one embodiment, a top lead 628 is deposited over each of the four resistors such that each of the four resistors comprises an individual bottom lead 604 or middle lead 614 and a top lead 628.

The one or more top leads may be fabricated by depositing a fifth photoresist 650 as a single layer on the third dielectric layer 624 and removing the fifth photoresist 650 from seventh portions 654 aligned with the middle leads 614. As such, the fifth photoresist remains on eighth portions 652 unaligned with the middle leads 614. The top leads 628 are then deposited in the seventh portions 654 aligned with the middle leads 614, and the fifth photoresist 650 is stripped and removed. The seventh portions 654, and thus, the top leads 628, may have the same length in the x-direction as the middle leads 614.

In operation 520, a gold (Au) pad fabrication process is performed, and the TMR sensor device or magnetic sensor formation process is completed. The Au pad fabrication process may include Au seed deposition, photo patterning, Au plating process, photo resist lift-off, and Au seed mill process.

Figure 7A:
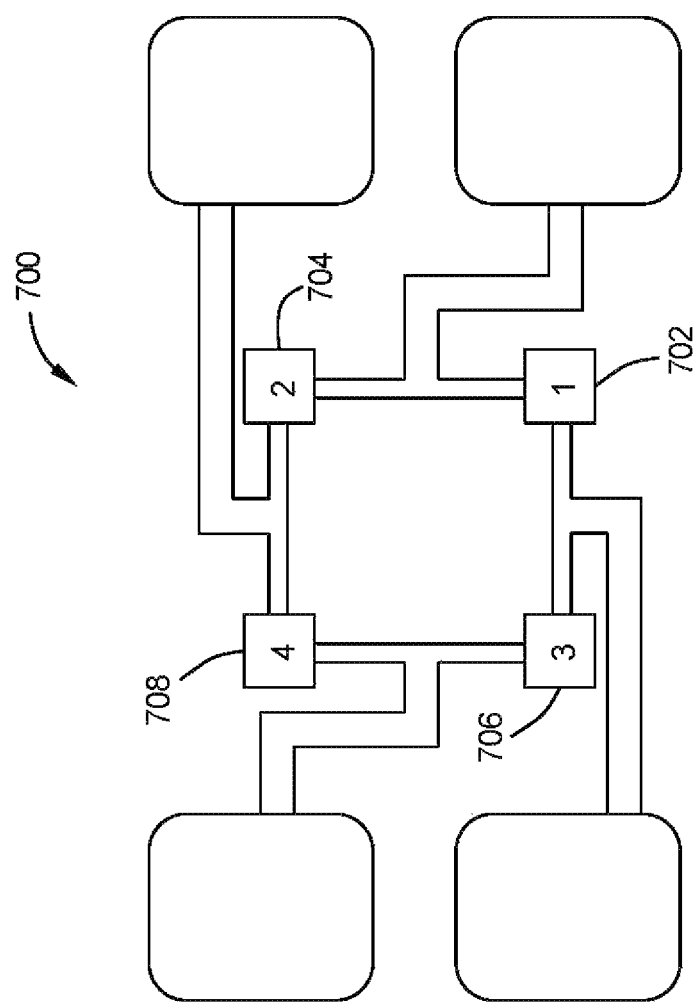
FIG. 7A illustrates a TMR sensor device or Wheatstone bridge comprising four TMR resistors, according to another embodiment.
Figure 7B:
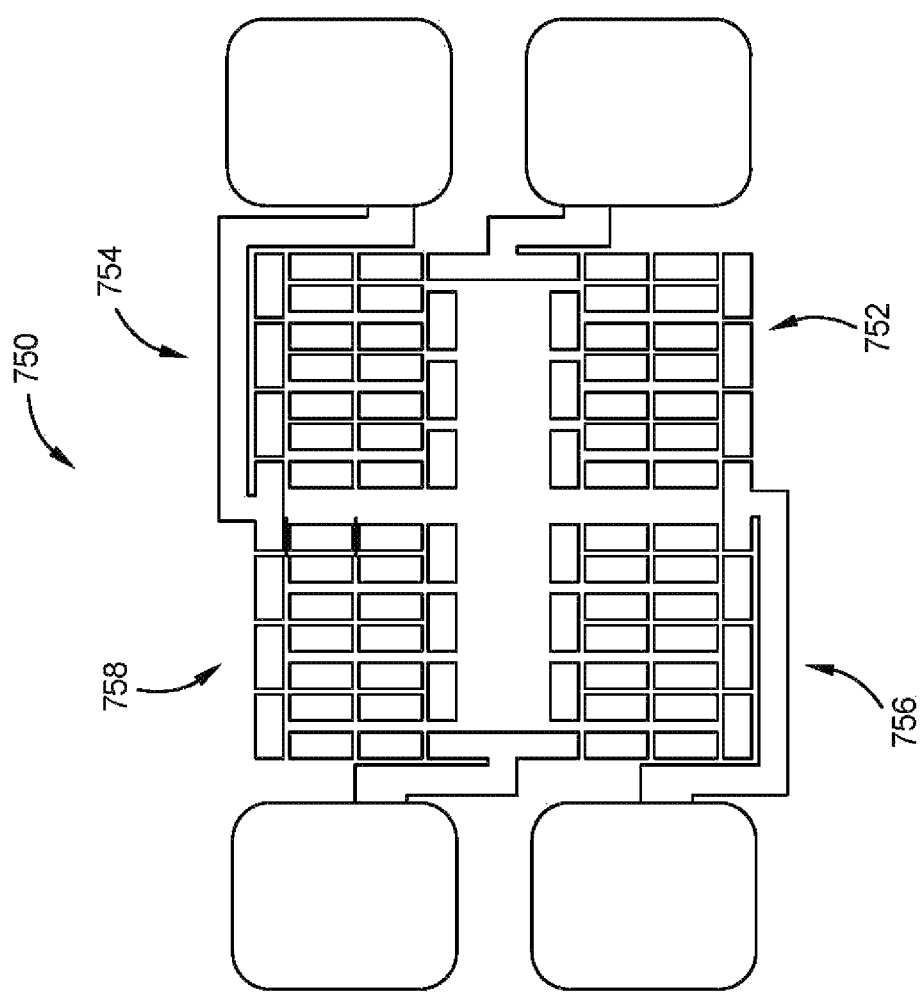
FIG. 7B illustrates four TMR resistor arrays, according to one embodiment.

FIG. 7A illustrates a TMR sensor device 700 or Wheatstone bridge comprising four TMR resistors 702, 704, 706, 708, according to another embodiment. FIG. 7B illustrates a TMR sensor device 750 or Wheatstone bridge comprising four TMR resistor arrays 752, 754, 756, 758, according to one embodiment. The TMR sensor devices 700, 750 may be formed using method 500.

In the TMR sensor device 700, the first resistor 702 and the fourth resistor 708 comprise the first TMR film 220 while the second resistor 704 and the third resistor 706 comprise the second TMR film 230. The first TMR resistor 702 may be the first resistor 104 of FIG. 1 or the first resistor 202 of FIG. 2. The second TMR resistor 704 may be the second resistor 106 of FIG. 1 or the second resistor 204 of FIG. 2. The third TMR resistor 706 may be the third resistor 108 of FIG. 1 or the third resistor 206 of FIG. 2. The fourth TMR resistor 708 may be the fourth resistor 110 of FIG. 1 or the fourth resistor 208 of FIG. 2.

The TMR sensor device 750 comprises a first resistor array 752, a second resistor array 754, a third resistor array 756, and a fourth resistor array 758. Each of the resistor arrays 752, 754, 756, 758 comprises a plurality of resistors coupled in series. To form the TMR sensor device 750, the method further includes pattern formation of four resistor arrays 752, 754, 756, 758 with designated geometries, shape, and number of resistors in series, forming top leads over the two resistor arrays with resistors in series made of the first TMR film to form a first resistor array 752 and a fourth resistor array 758, and forming top leads over the two resistor arrays with resistors in series made of the second TMR film to form the second resistor array 754 and a third resistor array 756. Thus, each of the resistors of the first resistor array 752 and the fourth resistor array 758 is comprised of the first TMR film, and each of the resistors of the second resistor array 754 and the third resistor array 756 is comprised of the second TMR film.

The number of resistors in each of the four resistor arrays 752, 754, 756, 758 can be chosen to have an odd number of columns and even number of row so that the top leads are in direct contact with the end resistors of the arrays 752, 754, 756, 758 to avoid forming vias for the top lead contacts. The first, second, third, and fourth resistor arrays 752, 754, 756, 758 are disposed in a same plane. The first resistor array 752 is adjacent to the second resistor array 754 and the third resistor array 756, the second resistor 754 array is adjacent to the first resistor array 752 and the fourth resistor array 758, the third resistor array 756 is adjacent to the first resistor array 752 and the fourth resistor array 758, and the fourth resistor array 758 is adjacent to the second resistor array 754 and the third resistor array 756.

Therefore, utilizing the above-described TMR sensor device or Wheatstone bridge design having four resistors comprised of two different TMR films results in a magnetic sensor operating at maximum efficiency with full range of magnetoresistance, hence accomplishing maximum output voltage. By using a first TMR film for the first and fourth resistors and a second TMR film for the second and third resistors, the TMR sensor device or Wheatstone bridge characteristic differential output is realized and fulfilled with maximum sensitivity. Furthermore, since the second and third resistors R2/R3 622 are disposed in a different plane than the first and fourth resistors R1/R4 612, the second and third resistors R2/R3 622 may be hot biased at different times than the first and fourth resistors R1/R4 612.

In one embodiment, the TMR sensor is used in a camera operating as a single axis sensor. An example of such a sensor is found in United States Patent Application Publication No.: 2019/0020822 A1, which is incorporated herein by reference. However, it is contemplated that the TMR sensor may be utilized as a two dimensional or even a three dimensional sensor. Additionally, it is contemplated that TMR sensor may be integrated and utilized in inertial measurement unit technologies other than cameras such as wearable devices, compasses, and MEMS devices. Furthermore, the TMR sensor may operate as a position sensor, a bridge angular sensor, a magnetic switch, a current sensor, or combinations thereof. The TMR sensor may be used to focus a camera such as a smart phone camera by using the TMR sensors as position and angular sensors. Also, TMR sensors have applicability in the automotive industry as switch, current, and angular sensors to replace current Hall, anisotropic magnetoresistance (AMR) and giant magnetoresistance (GMR) sensors. TMR sensors may also be used in the drones and robotics industry as position and angular sensors. Medical devices can also utilize TMR sensors for flow rate control for infusion systems and endoscope camera sensors among others. Thus, the TMR sensors discussed herein have applications well beyond smart phone cameras and thus should not be limited to use as sensors for smart phone cameras. Furthermore, TMR sensors need not be arranged in a Wheatstone bridge arrangement, but rather, may be arranged in any number of manners.

In one embodiment, a TMR sensor device comprises a first TMR resistor comprising a first TMR film, the first TMR film comprising a synthetic anti-ferromagnetic pinned layer having a magnetization direction of a first reference layer orthogonal to a magnetization direction of a first free layer, a second TMR resistor comprising a second TMR film, the second TMR film comprising a double synthetic anti-ferromagnetic pinned layer having a magnetization direction of a second reference layer orthogonal to a magnetization direction of a second free layer and opposite to the magnetization direction of the first reference layer of the first TMR film, a third TMR resistor comprising the second TMR film, and a fourth TMR resistor comprising the first TMR film, wherein the first and fourth TMR resistors are disposed in a first plane and the second and third TMR resistors are disposed in a second plane different than the first plane.

The first TMR resistor is adjacent to the second TMR resistor and the third TMR resistor, the second TMR resistor is adjacent to the first TMR resistor and the fourth TMR resistor, the third TMR resistor is adjacent to the first TMR resistor and the fourth TMR resistor, and the fourth TMR resistor is adjacent to the second TMR resistor and the third TMR resistor. The first reference layer of the first TMR film has a magnetization direction anti-parallel to a magnetization direction of a first pinned layer of the first TMR film. The first TMR film further comprises a first barrier layer, a first spacer layer, and a first antiferromagnet layer, and wherein the first barrier layer is disposed between the first reference layer and the first free layer, the first spacer layer is disposed between the first reference layer and the first pinned layer, and the first antiferromagnet layer is disposed adjacent to the first pinned layer.

The second TMR film comprises a second pinned layer and a third pinned layer disposed between the second reference layer and the second pinned layer, the second reference layer having a magnetization direction parallel to a magnetization direction of the second pinned layer and anti-parallel to a magnetization direction of the third pinned layer. The second TMR film further comprises a second barrier layer, a second spacer layer, a third spacer layer, and a second antiferromagnet layer, and wherein the second barrier layer is disposed between the second reference layer and the second free layer, the second spacer layer is disposed between the second reference layer and the third pinned layer, the third spacer layer is disposed between the third pinned layer film and the second pinned layer, and the second antiferromagnet layer is disposed adjacent to the second pinned layer. The first reference layer of the first TMR film comprises a Co/CoFe/Co multi-layer stack having a thickness of between about 20 Angstroms and about 30 Angstroms, and wherein the second reference layer of the second TMR film comprises a Co/CoFe/Co multi-layer stack having a thickness of between about 20 Angstroms and about 30 Angstroms.

In another embodiment, a method of fabricating a TMR sensor device comprising a first TMR resistor, a second TMR resistor, a third TMR resistor, and a fourth TMR resistor comprises forming a first bottom lead and a second bottom lead in a first dielectric layer, depositing a first TMR film over the first and second bottom leads and the first dielectric layer, forming the first TMR resistor and the fourth TMR resistor from the first TMR film by removing one or more first portions of the first TMR film disposed over the first dielectric layer, forming a plurality of middle leads, depositing a second TMR film over the plurality of middle leads, the second TMR film being different than the first TMR film, forming the second TMR resistor and the third TMR resistor from the second TMR film by removing one or more first portions of the second TMR film disposed over the first and second TMR resistors, and forming a plurality of top leads.

The first and fourth TMR resistors are disposed in a first plane and the second and third TMR resistors are disposed in a second plane different than the first plane. The first TMR resistor is adjacent to the second TMR resistor and the third TMR resistor, the second TMR resistor is adjacent to the first TMR resistor and the fourth TMR resistor, the third TMR resistor is adjacent to the first TMR resistor and the fourth TMR resistor, and the fourth TMR resistor is adjacent to the second TMR resistor and the third TMR resistor. The first TMR film comprises a synthetic anti-ferromagnetic pinned layer having a magnetization direction of a first reference layer orthogonal to a magnetization direction of a first free layer. The second TMR film comprises a double synthetic anti-ferromagnetic pinned layer having a magnetization direction of a second reference layer orthogonal to magnetization direction of a second free layer and opposite to the magnetization direction of the first reference layer of the first TMR film.

The first reference layer of the first TMR film has a magnetization direction anti-parallel to a magnetization direction of a first pinned layer of the first TMR film. The second TMR film further comprises a second pinned layer and a third pinned layer disposed between the second reference layer and the second pinned layer, the second reference layer having a magnetization direction parallel to a magnetization direction of the second pinned layer and anti-parallel to a magnetization direction of the third pinned layer. The plurality of middle leads comprise a first middle lead, a second middle lead, a third middle lead, and a fourth middle lead, and wherein the first middle lead is a top lead for the first TMR resistor, the second middle lead is a bottom lead for the second TMR resistor, a third middle lead is a bottom lead for the third TMR resistor, and a fourth middle lead is a top lead for the fourth TMR resistor. A first top lead is disposed on the first middle lead, a second top lead is disposed on the second TMR resistor, a third top lead is disposed on the third TMR resistor, and a fourth top lead is disposed on the fourth middle lead.

In another embodiment, a method of fabricating a TMR sensor device comprises forming a first bottom lead and a second bottom lead, depositing a first TMR film over the first and second bottom leads, the first TMR film comprising a synthetic anti-ferromagnetic pinned layer having a magnetization direction of a first reference layer orthogonal to a magnetization direction of a first free layer, depositing a first photoresist over first portions of the first TMR film disposed on the first bottom lead and the second bottom lead, etching second portions of the first TMR film to expose a first dielectric layer, removing the first photoresist, forming a first middle lead over the first TMR film and the first bottom lead, a second middle lead on the first dielectric layer adjacent to the first middle lead, a third middle lead on the first dielectric layer adjacent to the first middle lead, and a fourth middle lead over the first TMR film and the second bottom lead, depositing a second TMR film over the first, second, third, and fourth middle leads, the second TMR film comprising a double synthetic anti-ferromagnetic pinned layer having a magnetization direction of a second reference layer orthogonal to magnetization direction of a second free layer and opposite to the magnetization direction of the first reference layer of the first TMR film, depositing a second photoresist over first portions of the second TMR film disposed over the second and third middle leads, etching second portions of the second TMR film to expose the first and fourth middle leads, removing the second photoresist, and forming a first top lead over the first middle lead, a second top lead over the second TMR film and the second middle lead, a third top lead over the second TMR film and the third middle lead, and a fourth top lead over the fourth middle lead.

The first bottom lead, the first TMR film, and the first middle lead form a first resistor, the second bottom lead, the first TMR film, and the fourth middle lead form a fourth resistor, the second middle lead, the second TMR film, and the second top lead form a second resistor, and the third middle lead, the second TMR film, and the third top lead form a third resistor. The first resistor and the fourth resistor are disposed in a first plane and the second and third resistors are disposed in a second plane different than the first plane. The first, second, third, and fourth resistors are TMR resistors. The first reference layer of the first TMR film has a magnetization direction anti-parallel to a magnetization direction of a first pinned layer of the first TMR film. The second TMR film further comprises a second pinned layer and a third pinned layer disposed between the second reference layer and the second pinned layer, the second reference layer having a magnetization direction parallel to a magnetization direction of the second pinned layer and anti-parallel to a magnetization direction of the third pinned layer.

The first resistor is adjacent to the second resistor and the third resistor, the second resistor is adjacent to the first resistor and the fourth resistor, the third resistor is adjacent to the first resistor and the fourth resistor, and the fourth resistor is adjacent to the second resistor and the third resistor. The first resistor has a length less than the first middle lead, the second resistor has a length less than the second middle lead, the third resistor has a length less than the third middle lead, and the fourth resistor has a length less than the fourth middle lead. The first portion of the first TMR film and the first portion of the second TMR film are equal in size.

While the foregoing is directed to embodiments of the present disclosure, other and further embodiments of the disclosure may be devised without departing from the basic scope thereof, and the scope thereof is determined by the claims that follow.

What is claimed is:

1. A tunneling magnetoresistance (TMR) sensor device, comprising:
   a first TMR resistor comprising a first TMR film, the first TMR film comprising a synthetic anti-ferromagnetic pinned layer having a magnetization direction of a first reference layer orthogonal to a magnetization direction of a first free layer;
   a second TMR resistor comprising a second TMR film, the second TMR film comprising a double synthetic anti-ferromagnetic pinned layer having a magnetization direction of a second reference layer orthogonal to magnetization direction of a second free layer and opposite to the magnetization direction of the first reference layer of the first TMR film;
   a third TMR resistor comprising the second TMR film; and
   a fourth TMR resistor comprising the first TMR film, wherein the first and fourth TMR resistors are disposed in a first cross-sectional plane with respect to a first middle lead and the second and third TMR resistors are disposed in a second cross-sectional plane with respect to a second middle lead different than the first cross-sectional plane.

2. The TMR sensor device of claim 1, wherein the first TMR resistor is adjacent to the second TMR resistor and the third TMR resistor, the second TMR resistor is adjacent to the first TMR resistor and the fourth TMR resistor, the third TMR resistor is adjacent to the first TMR resistor and the fourth TMR resistor, and the fourth TMR resistor is adjacent to the second TMR resistor and the third TMR resistor.

3. The TMR sensor device of claim 1, wherein the first reference layer of the first TMR film has a magnetization direction anti-parallel to a magnetization direction of a first pinned layer of the first TMR film.

4. The TMR sensor device of claim 3, wherein the first TMR film further comprises a first barrier layer, a first spacer layer, and a first antiferromagnet layer, and wherein the first barrier layer is disposed between the first reference layer and the first free layer, the first spacer layer is disposed between the first reference layer and the first pinned layer, and the first antiferromagnet layer is disposed adjacent to the first pinned layer.

5. The TMR sensor device of claim 1, wherein the second TMR film further comprises a second pinned layer and a third pinned layer disposed between the second reference layer and the second pinned layer, the second reference layer having a magnetization direction parallel to a magnetization direction of the second pinned layer and anti-parallel to a magnetization direction of the third pinned layer.

6. The TMR sensor device of claim 5, wherein the second TMR film further comprises a second barrier layer, a second spacer layer, a third spacer layer, and a second antiferromagnet layer, and wherein the second barrier layer is disposed between the second reference layer and the second free layer, the second spacer layer is disposed between the second reference layer and the third pinned layer, the third spacer layer is disposed between the second pinned layer and the third pinned layer, and the second antiferromagnet layer is disposed adjacent to the second pinned layer.

7. The TMR sensor device of claim 1, wherein the first reference layer of the first TMR film comprises a Co/CoFe/Co multi-layer stack having a thickness of between about 20 Angstroms and about 30 Angstroms, and wherein the second reference layer of the second TMR film comprises a Co/CoFe/Co multi-layer stack having a thickness of between about 20 Angstroms and about 30 Angstroms.

8. A method of fabricating a TMR sensor device comprising a first TMR resistor, a second TMR resistor, a third TMR resistor, and a fourth TMR resistor, comprising:
    forming a first bottom lead and a second bottom lead in a first dielectric layer;
    depositing a first TMR film over the first and second bottom leads and the first dielectric layer;
    forming the first TMR resistor and the fourth TMR resistor from the first TMR film by removing one or more first portions of the first TMR film disposed over the first dielectric layer;
    forming a plurality of middle leads;
    depositing a second TMR film over the plurality of middle leads, the second TMR film being different than the first TMR film;
    forming the second TMR resistor and the third TMR resistor from the second TMR film by removing one or more first portions of the second TMR film disposed over the first and second TMR resistors; and
    forming a plurality of top leads, wherein the first and fourth TMR resistors are disposed in a first cross-sectional plane with respect to a first middle lead and the second and third TMR resistors are disposed in a second cross-sectional plane with respect to a second middle lead different than the first cross-sectional plane.

9. The method of claim 8,
    wherein the first TMR resistor is adjacent to and unaligned with the second TMR resistor and the third TMR resistor, the second TMR resistor is adjacent to and unaligned with the first TMR resistor and the fourth TMR resistor, the third TMR resistor is adjacent to and unaligned with the first TMR resistor and the fourth TMR resistor, and the fourth TMR resistor is adjacent to and unaligned with the second TMR resistor and the third TMR resistor.

10. The method of claim 8, wherein the first TMR film comprises a synthetic anti-ferromagnetic pinned layer having a magnetization direction of a first reference layer orthogonal to a magnetization direction of a first free layer, and
    wherein the second TMR film comprises a double synthetic anti-ferromagnetic pinned layer having a magnetization direction of a second reference layer orthogonal to magnetization direction of a second free layer and opposite to the magnetization direction of the first reference layer of the first TMR film.

11. The method of claim 8, wherein a first reference layer of the first TMR film has a magnetization direction anti-parallel to a magnetization direction of a first pinned layer of the first TMR film, and
    wherein the second TMR film further comprises a second pinned layer, a second reference layer, and a third pinned layer disposed between the second reference layer and the second pinned layer, the second reference layer having a magnetization direction parallel to a magnetization direction of the second pinned layer and anti-parallel to a magnetization direction of the third pinned layer.

12. The method of claim 8, wherein the plurality of middle leads comprise the first middle lead, the second middle lead, a third middle lead, and a fourth middle lead, and wherein the first middle lead is a top lead for the first TMR resistor, the second middle lead is a bottom lead for the second TMR resistors, a third middle lead is a bottom lead for the third TMR resistor, and a fourth middle lead is a top lead for the fourth TMR resistor.

13. The method of claim 12, wherein a first top lead is disposed on the first middle lead, a second top lead is disposed on the second TMR resistor, a third top lead is disposed on the third TMR resistor, and a fourth top lead is disposed on the fourth middle lead.

14. A method of fabricating a TMR sensor device, comprising:
    forming a first bottom lead and a second bottom lead;
    depositing a first TMR film over the first and second bottom leads, the first TMR film comprising a synthetic anti-ferromagnetic pinned layer having a magnetization direction of a first reference layer orthogonal to a magnetization direction of a first free layer;
    depositing a first photoresist over first portions of the first TMR film disposed on the first bottom lead and the second bottom lead;
    etching second portions of the first TMR film to expose a first dielectric layer;
    removing the first photoresist;
    forming a first middle lead over the first TMR film and the first bottom lead, a second middle lead on the first dielectric layer adjacent to the first middle lead, a third middle lead on the first dielectric layer adjacent to the first middle lead, and a fourth middle lead over the first TMR film and the second bottom lead;
    depositing a second TMR film over the first, second, third, and fourth middle leads, the second TMR film comprising a double synthetic anti-ferromagnetic pinned layer having a magnetization direction of a second reference layer orthogonal to magnetization direction of a second free layer and opposite to the magnetization direction of the first reference layer of the first TMR film;
    depositing a second photoresist over first portions of the second TMR film disposed over the second and third middle leads;
    etching second portions of the second TMR film to expose the first and fourth middle leads;
    removing the second photoresist; and
    forming a first top lead over the first middle lead, a second top lead over the second TMR film and the second middle lead, a third top lead over the second TMR film and the third middle lead, and a fourth top lead over the fourth middle lead.

15. The method of claim 14, wherein the first bottom lead, the first TMR film, and the first middle lead form a first resistor,
    wherein the second bottom lead, the first TMR film, and the fourth middle lead form a fourth resistor,
    wherein the second middle lead, the second TMR film, and the second top lead form a second resistor, and
    wherein the third middle lead, the second TMR film, and the third top lead form a third resistor.

16. The method of claim 15, wherein the first resistor and the fourth resistor are disposed in a first plane and the second and third resistors are disposed in a second plane different than the first plane.

17. The method of claim 15, wherein the first, second, third, and fourth resistors are TMR resistors.

18. The method of claim 15, wherein the first reference layer of the first TMR film has a magnetization direction anti-parallel to a magnetization direction of a first pinned layer of the first TMR film,
- wherein the second TMR film further comprises a second pinned layer and a third pinned layer disposed between the second reference layer and the second pinned layer, the second reference layer having a magnetization direction parallel to a magnetization direction of the second pinned layer and anti-parallel to a magnetization direction of the third pinned layer, and
- wherein the first resistor is adjacent to the second resistor and the third resistor, the second resistor is adjacent to the first resistor and the fourth resistor, the third resistor is adjacent to the first resistor and the fourth resistor, and the fourth resistor is adjacent to the second resistor and the third resistor.

19. The method of claim 15, wherein the first resistor has a length less than the first middle lead, the second resistor has a length less than the second middle lead, the third resistor has a length less than the third middle lead, and the fourth resistor has a length less than the fourth middle lead.

20. The method of claim 14, wherein the first portion of the first TMR film and the first portion of the second TMR film are equal in size.

* * * * *